United States Patent
Moriya et al.

(10) Patent No.: US 8,113,757 B2
(45) Date of Patent: Feb. 14, 2012

(54) INTERMEDIATE TRANSFER CHAMBER, SUBSTRATE PROCESSING SYSTEM, AND EXHAUST METHOD FOR THE INTERMEDIATE TRANSFER CHAMBER

(75) Inventors: Tsuyoshi Moriya, Nirasaki (JP); Hiroyuki Nakayama, Nirasaki (JP); Keisuke Kondoh, Nirasaki (JP); Hiroki Oka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 875 days.

(21) Appl. No.: 11/831,361

(22) Filed: Jul. 31, 2007

(65) Prior Publication Data

US 2008/0031710 A1 Feb. 7, 2008

Related U.S. Application Data

(60) Provisional application No. 60/836,968, filed on Aug. 11, 2006.

(30) Foreign Application Priority Data

Aug. 1, 2006 (JP) .................................. 2006-210304

(51) Int. Cl.
*B65G 65/34* (2006.01)
(52) U.S. Cl. ..................... 414/217; 414/411; 414/935
(58) Field of Classification Search ................. 414/217, 414/222.02, 411, 935
See application file for complete search history.

(56) References Cited

U.S. PATENT DOCUMENTS

| | | | |
|---|---|---|---|
| 5,188,136 A | 2/1993 | Kumagai | |
| 5,314,541 A | 5/1994 | Saito et al. | |
| 6,382,895 B1 * | 5/2002 | Konishi et al. ................ | 414/217 |
| 6,688,375 B1 * | 2/2004 | Turner et al. ................ | 165/48.1 |
| 7,665,951 B2 * | 2/2010 | Kurita et al. ................ | 414/805 |
| 2001/0019900 A1 | 9/2001 | Hasegawa et al. | |
| 2002/0020344 A1 | 2/2002 | Takano | |
| 2003/0022469 A1 | 1/2003 | Hasegawa et al. | |
| 2003/0054668 A1 * | 3/2003 | Kitano et al. ................ | 438/782 |

(Continued)

FOREIGN PATENT DOCUMENTS

CN 1758142 A 4/2006

(Continued)

OTHER PUBLICATIONS

Japanese Office Action mailed Aug. 2, 2011, in Japan Patent Application No. 2006-210304 (with English-language Translation).

*Primary Examiner* — Charles A Fox
(74) *Attorney, Agent, or Firm* — Oblon, Spivak, McClelland, Maier & Neustadt, L.L.P.

(57) ABSTRACT

An intermediate transfer chamber that can prevent formation of defects in substrates. The intermediate transfer chamber is provided between a loader module being in a first environment where the interior thereof is at a first pressure and contains moisture, and a chamber of a process module being in a second environment where the interior thereof is at a second pressure lower than the first pressure. The intermediate transfer chamber comprises a transfer arm comprising a pick that bidirectionally transfers a substrate between the loader module and the chamber and supports the substrate, a load-lock module exhaust system that exhausts the interior of the intermediate transfer chamber so as to reduce pressure in the intermediate transfer chamber from the first pressure to the second pressure, and a plate-like member that controls the conductance of exhaust on at least a principal surface of the substrate opposite to the pick when the interior of the intermediate transfer chamber is exhausted.

13 Claims, 4 Drawing Sheets

U.S. PATENT DOCUMENTS

| | | | |
|---|---|---|---|
| 2004/0092043 A1 | 5/2004 | Hasegawa et al. | |
| 2005/0087129 A1 | 4/2005 | Kitano et al. | |
| 2006/0090703 A1 | 5/2006 | Kaise et al. | |
| 2007/0127004 A1* | 6/2007 | Yonekawa | 355/53 |
| 2007/0289604 A1* | 12/2007 | Fukunaga et al. | 134/3 |
| 2008/0181750 A1* | 7/2008 | Moriya et al. | 414/217.1 |

FOREIGN PATENT DOCUMENTS

| | | |
|---|---|---|
| CN | 1779906 A | 5/2006 |
| JP | 5-31347 | 2/1993 |
| JP | 5-213604 | 8/1993 |
| JP | 6-196540 | 7/1994 |
| JP | 7-227534 | 8/1995 |
| JP | 9-129709 | 5/1997 |
| JP | 10-173025 | 6/1998 |
| JP | 2001-291671 | 10/2001 |
| JP | 2001-345255 | 12/2001 |
| JP | 2006-128578 | 5/2006 |
| KR | 1992-010780 | 6/1992 |
| KR | 1992-022398 | 12/1992 |
| KR | 2001-0093751 | 10/2001 |
| KR | 2003-0025199 | 3/2003 |

* cited by examiner

INTERMEDIATE TRANSFER CHAMBER, SUBSTRATE PROCESSING SYSTEM, AND EXHAUST METHOD FOR THE INTERMEDIATE TRANSFER CHAMBER

BACKGROUND OF THE INVENTION

1. Field of the Invention

The present invention relates to an intermediate transfer chamber, a substrate processing system, and an exhaust method for the intermediate transfer chamber. In particular, the present invention relates to an intermediate transfer chamber which is evacuated when a substrate is transferred.

2. Description of the Related Art

A substrate processing system that subjects waters as substrates to plasma processing is comprised of a process module that houses the wafers and subjects the wafers to plasma processing, a load-lock module implemented by an intermediate transfer chamber that transfers each wafer into the process module, and a loader module that removes each wafer from a container housing the wafers and transfers each wafer to the load-lock module.

In general, the load-lock module of the substrate processing system has a function of receiving a wafer under atmospheric pressure, evacuating a chamber to a predetermined pressure, opening a gate to the process module, transferring the wafer into the process module, transferring the wafer out of the process module upon completion of processing, closing the gate to the process module, returning the pressure in the chamber to atmospheric pressure, and transferring the wafer into the loader module (see e.g. Japanese Laid-Open Patent Publication (Kokai) No. 2006-128578).

Conventionally, there has been the problem that, in a process of evacuating the load-lock module, particles are produced in the chamber and become attached to and accumulate on surfaces of wafers to form defects in the wafers in wafer processing, resulting in the yield and reliability of semiconductor devices ultimately manufactured from the wafers decreasing.

As a probable mechanism for generation of particles in the chamber during evacuation, it is thought that in most cases, particles attached to and accumulated in the chamber are thrown up during evacuation and become attached to a wafer.

However, aside from the particle generation mechanism mentioned above, it has been found out that moisture in the chamber coagulates due to abrupt temperature decrease caused by adiabatic expansion of internal gas during evacuation, and as a result, particles are produced and become attached to a wafer. If a wafer with such particles attached thereto is subjected to processing, petal-shaped corrosion marks remain on the wafer, causing formation of defects in the wafer.

It has been found through observation that the temperature of internal gas decreases by about several tens ° C. during evacuation although it is heavily dependent on the type of gas, chamber capacity, exhaust velocity, and so on. If the chamber contains moisture, the moisture condenses around small particles to grow into large particles, which further coagulate into ice depending on temperature and become attached to a wafer. Even if no core particles are present within the chamber, there may be cases where the above phenomena, i.e. the condensation and the coagulation occur when the chamber contains moisture, for example, various ions in gas serve as condensation cores or water molecules flocculate into large particles, and which will cause a serious problem.

SUMMARY OF THE INVENTION

The present invention provides an intermediate transfer chamber, a substrate processing system, and an exhaust method for the intermediate transfer chamber, which can prevent formation of defects in substrates.

Accordingly, a first aspect of the present invention provides an intermediate transfer chamber provided between a first chamber being in a first environment where an interior thereof is at a first pressure and contains moisture, and a second chamber being in a second environment where an interior thereof is at a second pressure lower than the first pressure, comprising, a transfer device comprising a supporting portion that bidirectionally transfers a substrate between the first chamber and the second chamber and supports the substrate, an exhaust device that exhausts an interior of the intermediate transfer chamber so as to reduce pressure in the intermediate transfer chamber from the first pressure to the second pressure, and a conductance control device that controls a conductance of exhaust on at least a principal surface of the substrate opposite to the supporting portion when the exhaust device exhausts the interior of the intermediate transfer chamber.

According to the first aspect of the present invention, since the conductance of exhaust on at least the principal surface of the substrate opposite to the supporting portion is controlled when the interior of the intermediate transfer chamber is exhausted, the flow of gas directly above the substrate can be slowed. As a result, adiabatic expansion of internal gas directly above the substrate can be suppressed, and thus, attachment of particles produced due to adiabatic expansion can be prevented, and hence formation of defects can be prevented.

The first aspect of the present invention provides an intermediate transfer chamber, wherein the conductance control device comprises a plate-like member provided in opposed relation to the principal surface of the substrate.

According to the first aspect of the present invention, since the plate-like member is provided in opposed relation to the principal surface of the substrate, the conductance of exhaust on the principal surface of the substrate can be controlled with accuracy, and the flow of gas directly above the substrate can be reliably slowed. Moreover, although moisture in gas in the internal transfer chamber other than a gas directly above the wafer W coagulates due to adiabatic expansion, the plate-like member provided directly above the substrate acts as a cover for the substrate, and hence particles produced by the coagulation of moisture in the gas never become attached to the substrate. Thus, attachment of particles produced due to adiabatic expansion of internal gas to the substrate can be reliably prevented.

The first aspect of the present invention provides an intermediate transfer chamber, wherein the conductance control device controls the conductance on the principal surface of the substrate so as to prevent moisture on the principal surface of the substrate from coagulating or condensing when the exhaust device exhausts the interior of the intermediate transfer chamber.

According to the first aspect of the present invention, since the conductance on the principal surface of the substrate is controlled so as to prevent moisture on the principal surface of the substrate from coagulating or condensing when the interior of the intermediate transfer chamber is exhausted, attachment of particles produced due to adiabatic expansion of internal gas to the substrate can be appropriately prevented.

The first aspect of the present invention provides an intermediate transfer chamber, wherein the exhaust device exhausts the interior of the intermediate transfer chamber at a maximum exhaust velocity at which moisture on the principal surface of the substrate does not coagulates or condenses.

According to the first aspect of the present invention, since the interior of the intermediate transfer chamber is exhausted at the maximum exhaust velocity at which moisture on the principal surface of the substrate does not coagulates or condenses, the pressure of gas in the intermediate transfer chamber can be efficiently lowered while inhibiting the production of particles caused by adiabatic expansion of the internal gas, and hence coagulation of moisture in the gas caused by adiabatic expansion of the internal gas can be appropriately prevented.

The first aspect of the present invention provides an intermediate transfer chamber further comprising a moisture amount measurement device that measures an amount of moisture in the intermediate transfer chamber, and wherein the exhaust device exhausts the interior of the intermediate transfer chamber based on a result of measurement carried out by the moisture amount measurement device.

According to the first aspect of the present invention, since the amount of moisture in the intermediate transfer chamber is measured, and the interior of the intermediate transfer chamber is exhausted based on the measured amount moisture, the exhaust velocity can be appropriately changed according to the amount of moisture in the intermediate transfer chamber, and hence, coagulation of moisture in the intermediate transfer chamber can be appropriately prevented.

The first aspect of the present invention provides an intermediate transfer chamber further comprising a moisture detecting device that detects moisture coagulated or condensed in the intermediate transfer chamber, wherein the exhaust device exhausts the interior of the intermediate transfer chamber based on a result of detection carried out by the moisture detecting device.

According to the first aspect of the present invention, since moisture coagulated or condensed in the intermediate transfer chamber is detected, and the interior of the intermediate transfer chamber is exhausted based on the detection result, the exhaust velocity can be appropriately changed according to the result of detection of moisture generated in the intermediate transfer chamber, and hence, further coagulation of moisture in the intermediate transfer chamber can be appropriately prevented.

The first aspect of the present invention provides an intermediate transfer chamber further comprising a dry gas supply device that supplies a dry gas into the intermediate transfer chamber.

According to the first aspect of the present invention, since a dry gas is supplied into the intermediate transfer chamber, a moisture-containing gas in the intermediate transfer chamber can be replaced with the dry gas. Thus, moisture can be prevented from being present in gas in the intermediate transfer chamber, and hence coagulation of moisture in the gas due to adiabatic expansion can be eliminated.

The first aspect of the present invention provides an intermediate transfer chamber further comprising a heated gas supply device that supplies a gas heated to a predetermined temperature into the intermediate transfer chamber.

According to the first aspect of the present invention, since a gas heated to a predetermined temperature is supplied into the intermediate transfer chamber, moisture attached to an inner wall of the intermediate transfer chamber and a surface of the substrate can be evaporated. As a result, moisture in gas in the intermediate transfer chamber can be removed, and hence the moisture in the gas in the intermediate transfer chamber can be prevented from coagulating due to adiabatic expansion. Moreover, the temperature of gas in the intermediate transfer chamber can be prevented from lowering to a coagulation point of moisture due to adiabatic expansion when the interior of the intermediate transfer chamber is exhausted. Thus, the moisture in the gas never coagulate. Further, the temperature of gas in the intermediate transfer chamber can be made higher than that of moisture-containing atmosphere. As a result, moisture-containing atmosphere entering into the intermediate transfer chamber can be caused to flow into a lower part of the intermediate transfer chamber, so that the moisture-containing atmosphere can be prevented from spreading to an area above the substrate. Thus, coagulation of moisture above the substrate can be prevented.

The first aspect of the present invention provides an intermediate transfer chamber further comprising a boosting gas supply device that supplies a gas that increases pressure in the intermediate transfer chamber to a higher pressure than the first pressure into the intermediate transfer chamber.

According to the first aspect of the present invention, since a gas that increases pressure in the intermediate transfer chamber to a higher pressure than the first pressure is supplied into the intermediate transfer chamber, the pressure of gas in the intermediate transfer chamber can be made higher than that of moisture-containing atmosphere. As a result, moisture-containing atmosphere can be prevented from flowing into the intermediate transfer chamber, and hence the moisture-containing atmosphere to can be prevented from being supplied into the intermediate transfer chamber.

The first aspect of the present invention provides an intermediate transfer chamber further comprising a moisture decomposing gas supply device that supplies a gas that decomposes moisture in the intermediate transfer chamber into the intermediate transfer chamber.

According to the first aspect of the present invention, since a gas that decomposes moisture in the intermediate transfer chamber is supplied into the intermediate transfer chamber, moisture in gas in the intermediate transfer chamber can be decomposed. Thus, moisture can be prevented from being present in gas in the intermediate transfer chamber, and hence coagulation of moisture in the gas caused by adiabatic expansion can be eliminated.

The first aspect of the present invention provides an intermediate transfer chamber further comprising a shut-off gas supply device that jets out a gas that prevents entry of gas in the first chamber into the intermediate transfer chamber at a part of the intermediate transfer chamber which is in communication with the first chamber.

According to the first aspect of the present invention, since a gas that prevents entry of gas in the first chamber into the intermediate transfer chamber is jetted out at a part of the intermediate transfer chamber which is in communication with the first chamber, moisture-containing atmosphere can be prevented from entering into the intermediate transfer chamber. Thus, moisture-containing atmosphere can be prevented from being supplied into the intermediate transfer chamber.

The first aspect of the present invention provides an intermediate transfer chamber further comprising a cooling device that cools at least a part of the interior and an inside wall of the intermediate transfer chamber.

According to the first aspect of the present invention, since at least a part of the interior and an inside wall of the intermediate transfer chamber is cooled, moisture in gas in the intermediate transfer chamber can be coagulated to reduce the percentage of moisture in the gas, and hence coagulation of moisture in the gas caused by adiabatic expansion can be prevented.

The first aspect of the present invention provides an intermediate transfer chamber, wherein a dry gas is supplied into the first chamber.

According to the first aspect of the present invention, since a dry gas is supplied into the first chamber, moisture-containing atmosphere in the first chamber can be replaced with the dry gas. As a result, moisture-containing atmosphere can be prevented from flowing from the first chamber into the intermediate transfer chamber, and hence moisture-containing atmosphere can be prevented from being supplied into the intermediate transfer chamber.

Accordingly, a second aspect of the present invention provides an intermediate transfer chamber provided between a first chamber being in a first environment where an interior thereof is at a first pressure and contains moisture, and a second chamber being in a second environment where an interior thereof is at a second pressure lower than the first pressure, comprising, a transfer device comprising a supporting portion that bidirectionally transfers a substrate between the first chamber and the second chamber and supports the substrate, an exhaust device that exhausts an interior of the intermediate transfer chamber so as to reduce pressure in the intermediate transfer chamber from the first pressure to the second pressure, and a substrate lift-up device that lifts up the substrate so as to control a conductance on a principal surface of the substrate opposite to the supporting portion so as to prevent coagulation or condensation of moisture on the principal surface when the exhaust device exhausts the interior of the intermediate transfer chamber.

According to the second aspect of the present invention, since the substrate is lifted up so as to control conductance on the principal surface of the substrate supported by the supporting portion opposite to the supporting portion and prevent coagulation or condensation of moisture on the principal surface when the interior of the intermediate transfer chamber is exhausted, the flow of gas directly above the substrate can be slowed with ease. As a result, attachment of particles produced due to adiabatic expansion of internal gas can be prevented, and hence formation of detects in the substrate can be easily prevented.

Accordingly, a third aspect of the present invention provides a substrate processing system comprising at least a substrate processing apparatus that subjects a substrate to process, a substrate transfer apparatus that transfers the substrate, and the intermediate transfer chamber according to the first aspect of the present invention.

According to the third aspect of the present invention, since there is provided the intermediate transfer chamber according to the first aspect of the present invention, formation of defects in the substrate can be prevented.

Accordingly, a fourth aspect of the present invention provides an exhaust method for an intermediate transfer chamber provided between a first chamber being in a first environment where an interior thereof is at a first pressure and contains moisture, and a second chamber being in a second environment where an interior thereof is at a second pressure lower than the first pressure, and including a transfer device comprising a supporting portion that bidirectionally transfers a substrate between the first chamber and the second chamber and supports the substrate, comprising, an exhaust step of exhausting an interior of the intermediate transfer chamber so as to reduce pressure in the intermediate transfer chamber from the first pressure to the second pressure, and a conductance control step of controlling controls a conductance of exhaust on at least a principal surface of the substrate opposite to the supporting portion when the interior of the intermediate transfer chamber is exhausted in the exhaust step.

Accordingly, a fifth aspect of the present invention provides an exhaust method for an intermediate transfer chamber provided between a first chamber being in a first environment where an interior thereof is at a first pressure and contains moisture, and a second chamber being in a second environment where an interior thereof is at a second pressure lower than the first pressure, and including a transfer device comprising a supporting portion that bidirectionally transfers a substrate between the first chamber and the second chamber and supports the substrate, comprising, an exhaust step of exhausting an interior of the intermediate transfer chamber so as to reduce pressure in the intermediate transfer chamber from the first pressure to the second pressure, and a substrate lift-up step of lifting up the substrate so to control a conductance on a principal surface of the substrate opposite to the supporting portion so as to prevent coagulation or condensation of moisture on the principal surface when the interior of the intermediate transfer chamber is exhausted in the exhaust step.

The above and other objects, features, and advantages of the invention will become more apparent from the following detained description taken in conjunction with the accompanying drawings.

BRIEF DESCRIPTION OF THE DRAWINGS

FIGS. 3A to 3C are views useful in explaining variations of the evacuating process in FIG. 2, in which FIG. 3A shows a case where exhaust velocity is controlled, FIG. 3B shows a case where a cooling device is provided, and FIG. 3C shows a case where gas is jetted in the form of a curtain; and FIGS. 4A to 4C are views useful in explaining variations of the evacuating process in FIG. 2, in which FIG. 4A shows a case where a dry gas or the like is supplied, FIG. 4B shows a case where heated gas is supplied, and FIG. 4C shows pressure in a chamber is increased.

DETAILED DESCRIPTION OF THE PREFERRED EMBODIMENTS

The present invention will now be described in detail with reference to the drawings showing a preferred embodiment thereof.

First, a description will be given of a substrate processing system according to an embodiment of the present invention.

Figure 1:
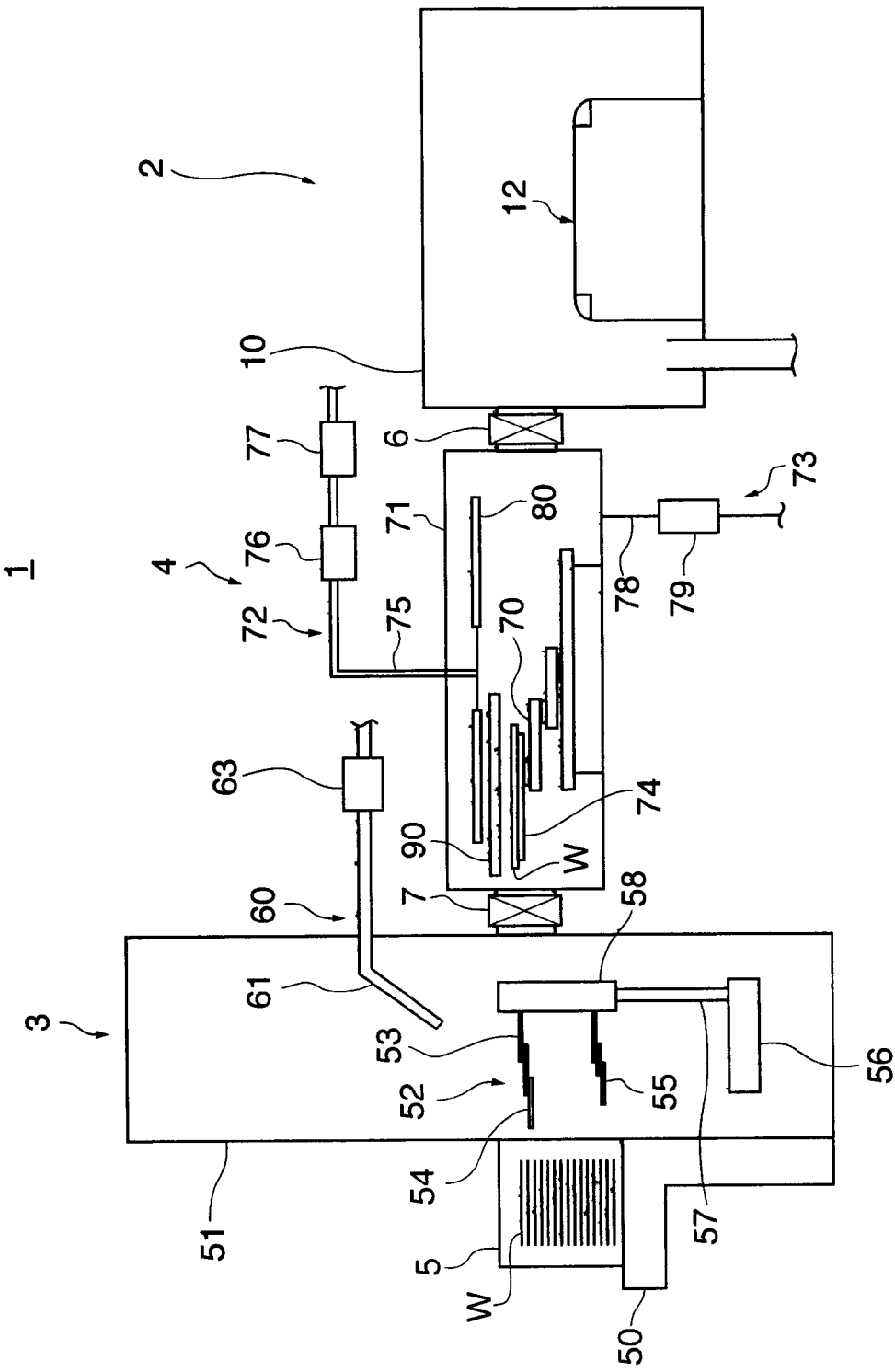
FIG. 1 is a sectional view schematically showing the construction of a substrate processing system according to an embodiment of the present invention.

FIG. 1 is a sectional view schematically showing the construction of a substrate processing system according to the embodiment.

As shown in FIG. 1, the substrate processing system 1 is comprised of process module (hereinafter referred to as "P/M") 2 that subjects semiconductor wafers (hereinafter referred to merely as "wafers") W as substrates to plasma processing such as RIE (Reactive Ion Etching) or ashing, an atmospheric transfer apparatus 3 that removes each wafer W from a FOUP (Front Opening Unified Pod) 5 as a container housing the wafers W, and a load-lock module (hereinafter referred to as "LL/M") 4 that is disposed between the atmospheric transfer apparatus 3 and the P/M 2, for transferring each wafer W from the atmospheric transfer apparatus 3 into the P/M 2 and from the P/M 2 into the atmospheric transfer apparatus 3.

Each of the P/M 2 and the LL/M 4 is constructed such that the interior thereof can be evacuated, while the interior of the atmospheric transfer apparatus 3 is always held at atmospheric pressure. Moreover, the P/M 2 and the LL/M 4, and the LL/M 4 and the atmospheric transfer apparatus 3, are connected together via gate valves 6 and 7, respectively. Each of the gate valves 6 and 7 can be opened and closed, so that the P/M 2 and the LL/M 4, and the LL/M 4 and the atmospheric transfer apparatus 3, can be in communication with one another or shut off from one another.

The atmospheric transfer apparatus 3 has FOUP mounting stages 50 on each of which the FOUP 5 is mounted, a loader module (hereinafter referred to as "L/M") 51 (first chamber), and a gas supply system 60 that supplies gas into the L/M 51.

The FOUP mounting stage 50 is a stage having a flat upper surface. The FOUP 5 houses, for example, 25 wafers W, which are mounted in a plurality of tiers at equal pitch. The L/M 51 has a rectangular parallelepiped box shape, and has therein a SCARA-type transfer arm 52 for transferring the wafers W.

FOUP openers, not shown, are provided in a side of the L/M 51 on which the FOUP mounting stages 50 are disposed and in opposed relation to the FOUPs 5 mounted on the respective FOUP mounting stages 50. The FOUP opener opens a front door of the FOUP 5 to bring the FOUP 5 and the interior of the L/M 51 into communication with each other.

The transfer arm 52 has an articulated transfer arm arm portion 53 that is constructed such as to be able to bend and extend, and a pick 54 that is attached to a distal end of the transfer arm arm portion 53. The pick 54 is constructed such that a wafer W is mounted directly thereon. Moreover, the transfer arm 52 has an articulated mapping arm 55 which is constructed such as to be able to bend and extend, a mapping sensor, not shown, that, for example, emits a laser beam so as to verify whether or not a wafer W is present being disposed at a distal end of the mapping arm 55. A base end of each of the transfer arm arm portion 53 and the mapping arm 55 is linked to a rising/falling stage 58 that rises/falls along an arm base end supporting pillar 57 that is provided standing upright from a base 56 of the transfer arm 52. Moreover, the arm base end supporting pillar 57 is constructed such as to be able to turn. In a mapping operation carried out for verifying the positions and number of the wafers W housed in the FOUP 5, in a state with the mapping arm 55 extended, the mapping arm 55 rises and falls, and verifies the positions and number of the wafers W in the FOUP 5.

The transfer arm 52 can freely bend via the transfer arm arm portion 53 and can freely turn via the arm base end supporting pillar 57, and hence a wafer W mounted on the pick 54 can be freely transferred between the FOUP 5 and the LL/M 4.

The gas supply system 60 has a gas introducing pipe 61 that penetrates through from outside the L/M 51 to inside the L/M 51, a gas supply apparatus, not shown, that is connected to an end of the gas introducing pipe 61 on the outside of the L/M 51, and a control valve 63 that is disposed in the gas introducing pipe 61 between the L/M 51 and the gas supply apparatus. In the present embodiment, the gas supply system 60 supplies a dry gas such as $N_2$ gas or dry air into the L/M 51 to reduce the amount of moisture in the L/M 51.

The LL/M 4 has a chamber 71 in which is disposed a transfer arm 70 (transfer unit) that can bend, extend, and turn, and which has plate-like member 90 (conductance control unit) provided in opposed relation to and directly above a wafer mounting surface of a pick 74, described later, of the transfer arm 70, a gas supply system 72 that supplies gas into the chamber 71, and an LL/M exhaust system 73 that exhausts the interior of the chamber 71.

The transfer arm 70 is a SCARA-type transfer arm comprising a plurality of arm portions, and has the pick 74 (supporting portion) attached to a distal end thereof. The pick 74 is constructed such that a wafer W is mounted directly thereon. The shape of the pick 74 is substantially the same as that of the pick 54.

When a wafer W is to be transferred from the atmospheric transfer apparatus 3 into the P/M 2, once the gate valve 7 has been opened, the transfer arm 70 receives the wafer W from the transfer arm 52 in the L/M 51, and once the gate valve 6 has been opened, the transfer arm 70 enters into a chamber 10 (second chamber) of the P/M 2, and mounts the wafer W on upper ends of pusher pins, not shown, projecting out from an upper surface of a mounting stage 12. Moreover, when the wafer W is to be transferred from the P/M 2 into the atmospheric transfer apparatus 3, once the gate valve 6 has been opened, the transfer arm 70 enters into the chamber 10 of the P/M 2 and receives the wafer W mounted on the upper ends of the pusher pins projecting out from the upper surface of the mounting stage 12, and once the gate valve 7 has been opened, the transfer arm 70 passes the wafer W to the transfer arm 52 in the L/M 51. It should be noted that the transfer arm 70 is not limited to being of a SCARA type, but rather may be a frog leg type or a double arm type.

The gas supply system 72 has a gas introducing pipe 75 that penetrates through from outside the chamber 71 to inside the chamber 71, a gas supply apparatus, not shown, that is connected to an end of the gas introducing pipe 75 on the outside of the chamber 71, a control valve 77 that is disposed in the gas introducing pipe 75 between the chamber 71 and the gas supply apparatus, a heating unit 76 that is disposed in the gas introducing pipe 75 between the chamber 71 and the control valve 77, and a gas supply port that is disposed at an end of the gas introducing pipe 75 on the inside of the chamber 71 and jets out gas. In the present embodiment, there may be a pair of break filters 80 at an end of the gas supply port. In the present embodiment, the gas supply system 72 supplies an inert gas, a dry gas such as $N_2$ gas or dry air, a gas heated to a predetermined high temperature by the heating unit 76, or a gas that decomposes moisture, described later, into the chamber 71. Each of the break filters 80 is a porous ceramic filter having a length thereof set to, for example, 200 mm.

The L/LM exhaust system 73 has an exhaust pipe 78 that penetrates through into the chamber 71, and a control valve 79 that is disposed part way along the exhaust pipe 78; the L/LM exhaust system 73 operates in collaboration with the gas supply system 72 described above to control the pressure in the chamber 71.

Next, a description will be given of an evacuating process carried out by the LL/M 4 appearing in FIG. 1.

In transferring a wafer W when the evacuating process is carried out, first, the transfer arm 52 transfers the wafer W housed in the FOUP 6 into the chamber 71 of the LL/M4 under atmospheric pressure, the LL/M exhaust system 73 evacuates the chamber 71 after the gate valve 7 is closed, and when the pressure in the chamber 71 becomes equal to a predetermined pressure, the gate valve 6 is opened, so that the transfer arm 70 transfers the wafer W into the chamber 10 of the P/M 2.

Conventionally, there has been the problem that, in a process of evacuating the chamber 71 of the LL/M 4 when a wafer W is transferred, gas in the chamber 71 is abruptly cooled by adiabatic expansion, so that moisture in the gas in the chamber 71 coagulates, resulting in minute particles becoming attached to the wafer W.

Figure 2:
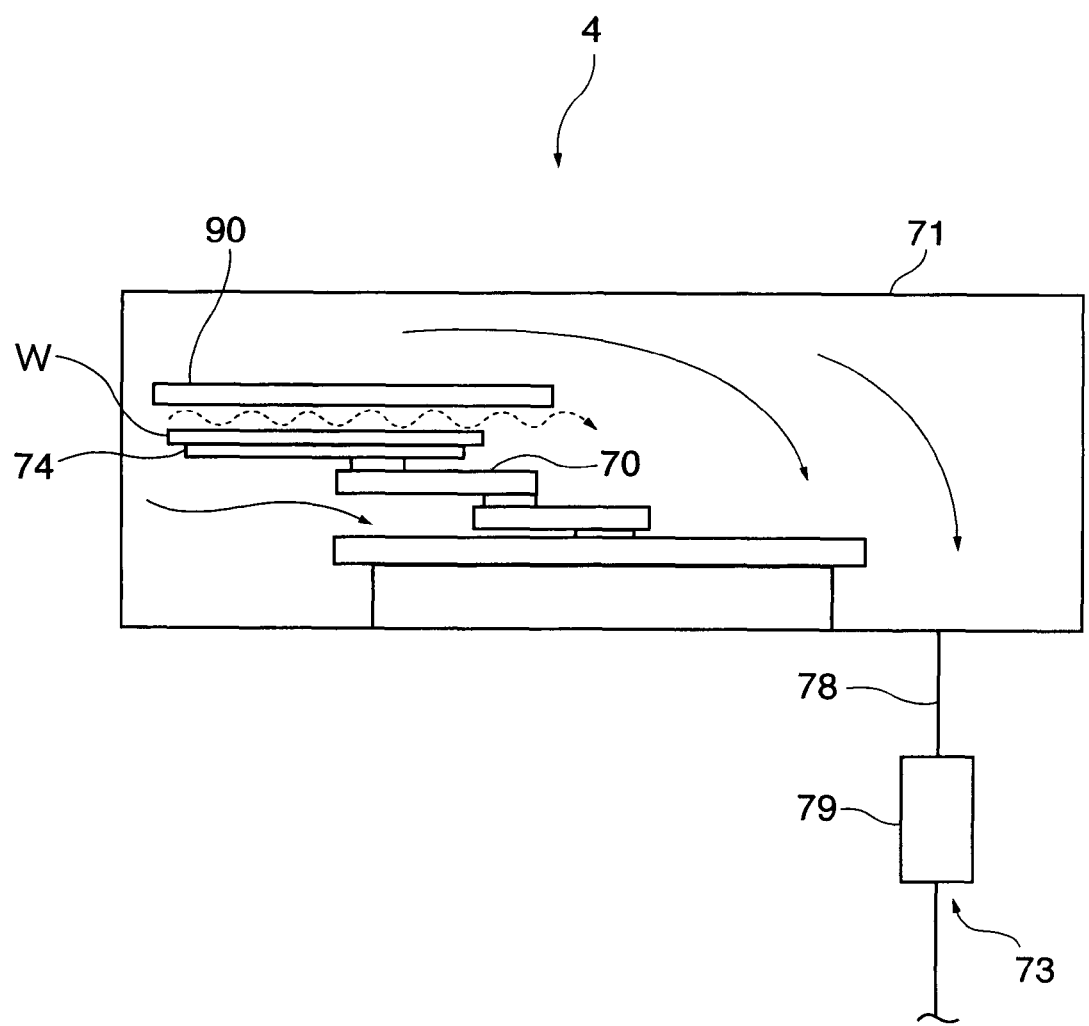
FIG. 2 is a view useful in explaining an evacuating process carried out by an LL/M appearing in FIG. 1.

In the present embodiment, as shown in FIG. 2, the plate-like member 90 is provided directly above and in opposed relation to the wafer mounting surface of the pick 74 of the transfer arm 70 so that the conductance of gas flow directly above a wafer W mounted on the wafer mounting surface of the pick 74 can be small. Thus, the flow of gas directly above a wafer W can be slowed when the LL/M exhaust system 73 evacuates the chamber 71, and as a result, the coagulation of moisture in the gas caused by adiabatic expansion of the gas can be prevented. Also, although moisture in gas in the chamber 71 other than the gas directly above the wafer W coagulates due to adiabatic expansion, the plate-like member 90 provided directly above the wafer W acts as a cover for the wafer W, and hence particles produced by the coagulation of moisture in the gas never become attached to the wafer W.

It should be noted that the inventors of the present invention have found that the exhaust velocity of gas may be lowered to 3.8 l/sec so as to prevent the coagulation of moisture in gas, and the conductance directly above a wafer W corresponding to the exhaust velocity is 46.3 l/sec. Here, assuming that the length of the chamber 71 in a direction in which gas flows (the length of the chamber 71 in a horizontal direction as viewed in FIG. 2) is 379 mm, and the length of the chamber 71 in a direction perpendicular to the direction in which gas flows (the length of the chamber 71 in the direction of the depth as viewed in FIG. 2) is 309 mm, it is preferred that the distance between a wafer W mounted on the wafer mounting surface of the pick 74 and the plate-like member 90 is set to 10.7 mm.

According to the present embodiment, since the plate-like member 90 that controls the conductance of gas flow directly above a wafer W mounted on the wafer mounting surface of the pick 74 slows the flow of gas directly above the wafer W, the attachment of particles produced due to adiabatic expansion of internal gas to the wafer W can be prevented in the process of evacuating the chamber 71 in the LL/M4, and as a result, formation of defects in the wafer W can be prevented.

Moreover, although in the present embodiment, the plate-like member 90 is provided directly above and in opposed relation to the wafer mounting surface of the pick 74 so that the conductance directly above a wafer W mounted on the wafer mounting surface of the pick 74 can be small, the plate-like member 90 should not necessarily be provided, but a wafer W mounted on the wafer mounting surface of the pick 74 may be lifted up to become closer to the ceiling of the chamber 71 so as to make the conductance directly above the wafer W small.

Moreover, in the present embodiment, the exhaust of gas can be slowed by controlling the exhaust velocity in the evacuation of the chamber 71 by the LL/M exhaust system 73. This makes it possible to slowly decrease the pressure of gas in the chamber 71 and hence prevent moisture in the gas from coagulating due to adiabatic expansion.

Figure 3A:
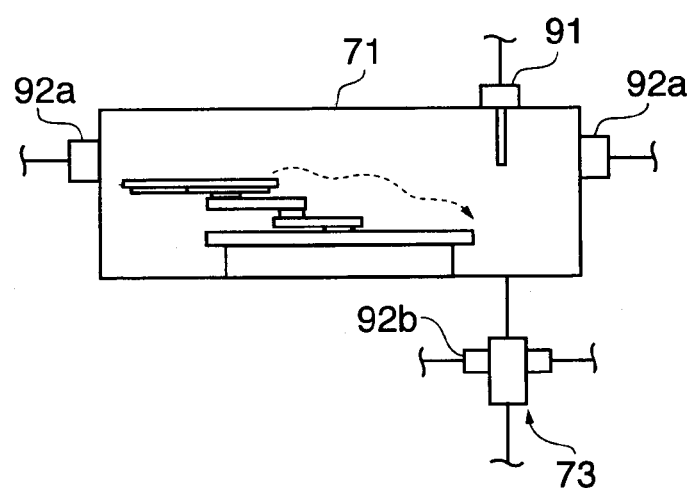

Moreover, in the present embodiment, as shown in FIG. 3A, a hydrometer 91 may be provided in the chamber 71 to measure the amount of moisture in the chamber 71 using the hydrometer 91, and the exhaust velocity in the evacuation of the chamber 71 by the LL/M exhaust system 73 may be dynamically controlled based on the measurement result. This makes it possible to appropriately change the exhaust velocity according to the amount of moisture in the chamber 71 and hence appropriately prevent coagulation of moisture in the chamber 17.

Moreover, in the present embodiment, as shown in FIG. 3A, a particle monitor 92a may be provided in the chamber 71 to detect particles produced due to adiabatic expansion of gas in the chamber 71, and the exhaust velocity in the evacuation of the chamber 71 by the LL/M exhaust system 73 may be dynamically controlled based on the detection result. This makes it possible to appropriately change the exhaust velocity according to the detected particles generated in the chamber 71 and hence appropriately prevent coagulation of moisture in the chamber 71. In the present embodiment, a particle monitor 92b may be provided in an exhaust line of the LL/M exhaust system 73 in the chamber 71 to detect exhaust particles, and the exhaust velocity in the evacuation of the chamber 71 by the LL/M exhaust system 73 may be dynamically controlled based on the exhaust particle detection result. It should be noted that the particle monitors 92a and 92b detect particles using a laser light scattering method, for example.

Figure 3B:
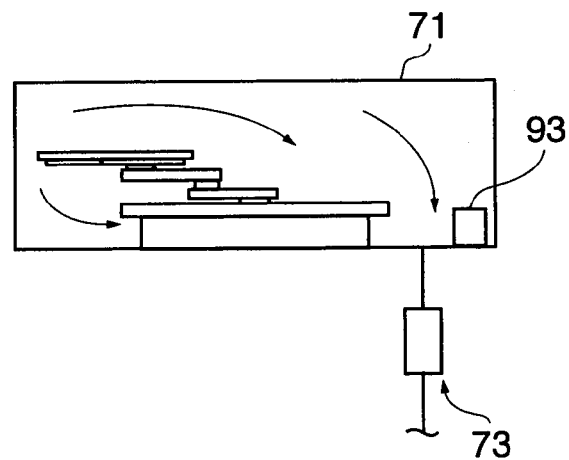

Moreover, in the present embodiment, as shown in FIG. 3B, a cooling device 93 having a cooler or the like being in contact with gas in the chamber 71 may be provided in the chamber 71 to coagulate moisture in the gas in the chamber 71 so that the percentage of moisture in the gas can be lowered. This makes it possible to reduce the percentage of moisture in the gas in the chamber 71 when the LL/M exhaust system 73 evacuates the chamber 71 and hence prevent the moisture in the gas from coagulating due to adiabatic expansion. Although in the present embodiment, the cooling device 93 is provided in the chamber 71 so as to reduce the percentage of moisture in gas in the chamber 71, the cooling device 93 should not necessarily be provided, but the percentage of moisture in gas in the chamber 71 can be reduced by cooling at least part of the interior of the chamber 71 and an inside wall of the chamber 71 to a temperature at which moisture coagulates.

Figure 3C:
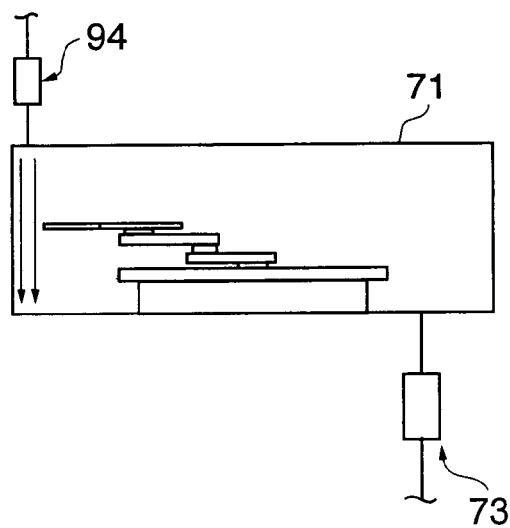

Moreover, in the present embodiment, as shown in FIG. 3C, a gas jetting system 94 may be provided in the part of the chamber 71 which is in communication with the gate valve 7, and gas may be jetted in curtain form in the vicinity of the gate valve 7 from the gas jetting system 94 so as to prevent moisture-containing atmosphere in the L/M 51 from entering into the chamber 71 when the gate valve 7 is opened. This makes it possible to prevent moisture-containing atmosphere in the L/M 51 from entering into the chamber 71 and hence prevent moisture-containing atmosphere from being supplied to the chamber 71.

Figure 4A:
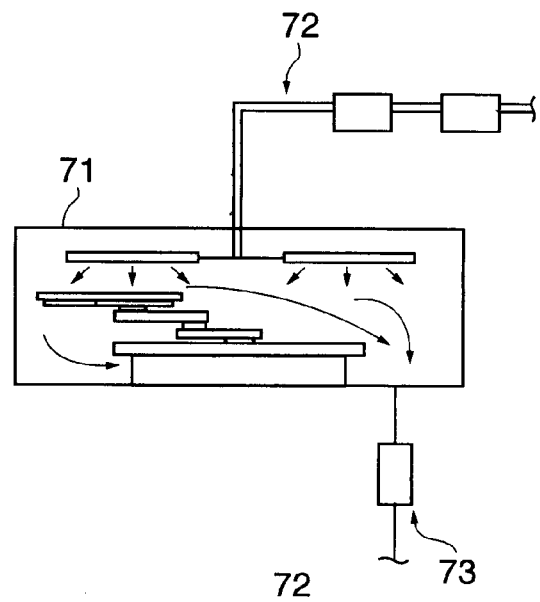

Moreover, in the present embodiment, as shown in FIG. 4A, the gas supply system 72 may supply a dry gas such as $N_2$ gas or dry air into the chamber 71, and moisture-containing gas in the chamber 71 may be replaced with the dry gas. This makes it possible to prevent moisture from being present in gas in the chamber 71 and hence eliminate coagulation of moisture in the gas caused by adiabatic expansion when the LL/M exhaust system 73 evacuates the chamber 71.

Moreover, in the present embodiment, as shown in FIG. 4A, the gas supply system 72 may supply a gas that decomposes moisture into the chamber 71 so as to decompose moisture in the gas in the chamber 71. This makes it possible to prevent moisture from being present in the gas in the chamber 71 and hence eliminate coagulation of moisture in the gas caused by adiabatic expansion when the LL/M exhaust system 73 evacuates the chamber 71. The gas that decomposes moisture can be supplied in an arbitrary manner, and the gas that decomposes moisture should not necessarily be supplied in a monotonous manner. For example, the gas that decomposes moisture may be supplied after being pulsated so as to efficiently decompose moisture, or may be supplied while pressure is being varied through pulsation. This makes it possible to promote the mixture of the gas that decomposes moisture and the gas that contains moisture and hence efficiently decomposes the moisture.

The gas that decomposes moisture is any o oxyhalogens, and examples of the gas that decomposes moisture include a methylsilane compound, dichloropropane, dibromopropane, nitrosyl chloride, carbosilane chloride, carbosilane fluoride, diborane, chlorine, fluorine, thionyl bromide, iodomethylpropane, acetyl chloride, acetone diethylacetal, and carbon monoxide. Examples of the methylsilane compound include trimethylchlorosilane, dimethylchlorosilane, monomethylchlorosilane, and tetramethylchlorosilane.

Figure 4B:
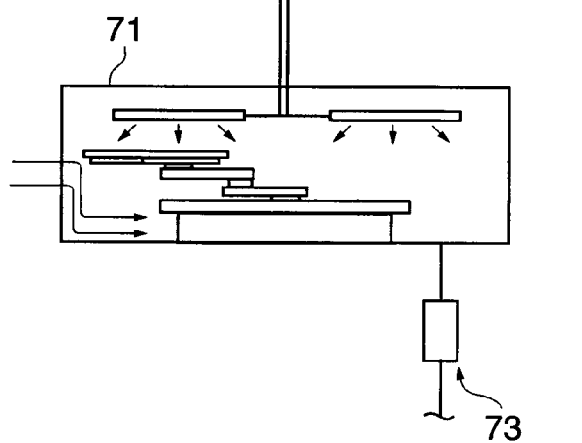

Moreover, in the present embodiment, as shown in FIG. 4B, the gas supply system 72 may supply gas heated to a temperature of 100° C. or higher into the chamber 71, to evaporate moisture attached to an inside wall of the chamber 71 and a surface of a wafer W. This makes it possible to remove moisture from gas in the chamber 71 and hence eliminate coagulation of moisture in the gas in the chamber 71 caused by adiabatic expansion when the LL/M exhaust system 73 evacuates the chamber 71.

Moreover, the gas supply system 72 may supply a gas heated to a predetermined temperature or higher into the chamber 71 so as to prevent the temperature of gas in the chamber 71 from decreasing to a moisture coagulation point due to adiabatic expansion when the LL/M exhaust system 73 evacuates the chamber 71. This makes it possible to prevent the temperature of the gas in the chamber 71 from decreasing to a moisture coagulation point due to adiabatic expansion of the gas and hence eliminate coagulation of moisture in the gas. Further, if the gas heated to the predetermined temperature or higher is supplied into the chamber 71 as mentioned above, the temperature of gas in the chamber 71 can be made higher than that of moisture-containing atmosphere in the L/M 51. As a result, moisture-containing atmosphere flowing from the L/M 51 into the chamber 71 when the gate valve 7 is opened can be caused to flow into a lower part of the chamber 71, so that the moisture-containing atmosphere to can be prevented from passing to an area above a wafer W mounted on the wafer mounting surface of the pick 74. Thus, coagulation of moisture above a wafer W can be prevented.

Figure 4C:
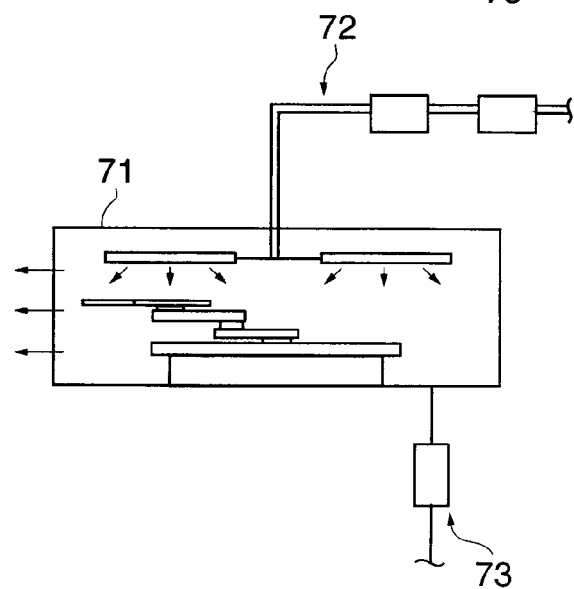

Moreover, in the present embodiment, as shown in FIG. 4C, the gas supply system 72 may supply a dry gas into the chamber 71, and thereby the pressure of gas in the chamber 71 may be made higher than that of moisture-containing atmosphere in the L/M 51. This makes it possible to prevent moisture-containing atmosphere in L/M 51 from flowing into the chamber 51 when the gate valve 7 is opened and hence prevent the moisture-containing atmosphere from being supplied into the chamber 71.

Moreover, in the present embodiment, as shown in FIG. 1, the gas supply system 60 may supply a dry gas such as $N_2$ gas or dry air into the L/M 51 to replace moisture-containing atmosphere in the L/M 51 with the dry gas. This makes it possible to prevent moisture-containing atmosphere from flowing into the chamber 71 of the LL/M 4 when the gate valve 7 is opened and hence prevent the moisture-containing atmosphere from being supplied into the chamber 71. Also, the same effects can be obtained if the gas supply system 60 supplies the above-mentioned gas that decomposes moisture into the L/M 51 to decompose moisture in atmosphere in the L/M 51.

What is claimed is:

1. An intermediate transfer chamber provided between a first chamber being in a first environment where an interior thereof is at a first pressure and contains moisture, and a second chamber being in a second environment where an interior thereof is at a second pressure lower than the first pressure, comprising:
    a transfer device comprising a supporting portion that bidirectionally transfers a substrate between the first chamber and the second chamber and supports the substrate;
    an exhaust device that exhausts an interior of the intermediate transfer chamber so as to reduce pressure in the intermediate transfer chamber from the first pressure to the second pressure; and
    a conductance control device that lowers a conductance of exhaust on at least a principal surface of the substrate opposite to said supporting portion when said exhaust device exhausts the interior of the intermediate transfer chamber,
    wherein the intermediate transfer chamber includes an inner space in which said transfer device can move horizontally, and
    wherein said conductance control device comprises a plate member provided in opposed relation to the principal surface of the substrate, the plate member covering less than half of the inner space with respect to the horizontal direction thereof.

2. An intermediate transfer chamber according to claim 1, wherein said conductance control device controls the conductance on the principal surface of the substrate so as to prevent moisture on the principal surface of the substrate from coagulating or condensing when said exhaust device exhausts the interior of the intermediate transfer chamber.

3. An intermediate transfer chamber according to claim 1, wherein distance between the substrate and the plate member is less than or equal to 10.7 mm.

4. An intermediate transfer chamber according to claim 3, further comprising a moisture amount measurement device that measures an amount of moisture in the intermediate transfer chamber, and
    wherein said exhaust device exhausts the interior of the intermediate transfer chamber based on a result of measurement carried out by said moisture amount measurement device.

5. An intermediate transfer chamber according to claim 3, further comprising a moisture detecting device that detects moisture coagulated or condensed in the intermediate transfer chamber,
    wherein said exhaust device exhausts the interior of the intermediate transfer chamber based on a result of detection carried out by said moisture detecting device.

6. An intermediate transfer chamber according to claim 1, further comprising a dry gas supply device that supplies a dry gas into the intermediate transfer chamber.

7. An intermediate transfer chamber according to claim 1, further comprising a heated gas supply device that supplies a gas heated to a predetermined temperature into the intermediate transfer chamber.

8. An intermediate transfer chamber according to claim 1, further comprising a boosting gas supply device that supplies a gas that increases pressure in the intermediate transfer chamber to a higher pressure than the first pressure into the intermediate transfer chamber.

9. An intermediate transfer chamber according to claim 1, further comprising a moisture decomposing gas supply device that supplies a gas that decomposes moisture in the intermediate transfer chamber into the intermediate transfer chamber.

10. An intermediate transfer chamber according to claim 1, further comprising a shut-off gas supply device that jets out a shut-off gas in curtain form that prevents entry of an atmosphere gas in the first chamber into the intermediate transfer chamber at a part of the intermediate transfer chamber which is in communication with the first chamber.

11. An intermediate transfer chamber according to claim 1, further comprising a cooling device that cools at least a part of the interior and an inside wall of the intermediate transfer chamber.

12. An intermediate transfer chamber according to claim 1, wherein the first chamber comprises a dry gas supply device that supplies a dry gas thereinto.

13. A substrate processing system comprising at least a substrate processing apparatus that subjects a substrate to process, a substrate transfer apparatus that transfers the substrate, and a intermediate transfer chamber as claimed in claim 1.

* * * * *